(12) United States Patent
Shibata

(10) Patent No.: US 6,814,879 B2
(45) Date of Patent: Nov. 9, 2004

(54) METHOD FOR FORMING PATTERN

(75) Inventor: Tsuyoshi Shibata, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/960,316

(22) Filed: Sep. 24, 2001

(65) Prior Publication Data

US 2002/0036183 A1 Mar. 28, 2002

(30) Foreign Application Priority Data

Sep. 27, 2000 (JP) ............................. 2000-294981

(51) Int. Cl.$^7$ ............................. H01L 21/00; B44C 1/22
(52) U.S. Cl. ............................. 216/41; 216/44; 216/47; 438/725
(58) Field of Search ............................. 216/41, 44, 47; 438/725

(56) References Cited

U.S. PATENT DOCUMENTS

| | | | | |
|---|---|---|---|---|
| 5,066,566 A | * | 11/1991 | Novembre | 430/296 |
| 5,403,438 A | * | 4/1995 | Motoyama | 216/47 |
| 5,871,383 A | * | 2/1999 | Levine et al. | 445/52 |
| 5,950,106 A | * | 9/1999 | May et al. | 438/669 |
| 5,952,243 A | * | 9/1999 | Forester et al. | 438/693 |

FOREIGN PATENT DOCUMENTS

| | | | | |
|---|---|---|---|---|
| JP | 3-13949 | 1/1991 | | |
| JP | 406005629 A | * 1/1994 | | H01L/21/338 |
| JP | 7-135140 | 5/1995 | | |
| JP | 07-135140 A | * 5/1995 | | H01L/21/027 |
| JP | 411283910 A | * 10/1999 | | H01L/21/027 |
| JP | 2000-3029 | 1/2000 | | |

OTHER PUBLICATIONS

IBM Technical Disclosure Bulletin, May 1986, US vol. 28, pp. 5183–5184.*

* cited by examiner

Primary Examiner—Nadine G. Norton
Assistant Examiner—Shamim Ahmed
(74) Attorney, Agent, or Firm—Finnegan, Henderson, Farabow, Garrett & Dunner, L.L.P.

(57) ABSTRACT

A method of forming a pattern, which comprises forming a first resist film on a surface of a substrate, patterning the first resist film to form a first resist pattern, and forming a covering layer containing silicon or a metal on the first resist pattern by making use of a coating method using a solution containing a solvent which is incapable of dissolving the first resist.

14 Claims, 5 Drawing Sheets

METHOD FOR FORMING PATTERN

CROSS-REFERENCE TO RELATED APPLICATIONS

This application is based upon and claims the benefit of priority from the prior Japanese Patent Application No. 2000-294981, filed on Sep. 27, 2000, the entire contents of which are incorporated by reference.

BACKGROUND OF THE INVENTION

1. Field of the Invention

The present invention relates to a method of forming a pattern, and in particular, to an improvement on the method of forming a multi-layer resist pattern, which is designed to be employed in the step of lithography in the manufacturing process of semiconductor device.

2. Description of the Related Art

According to the conventional method, a multi-layer resist pattern has been formed as follows. First of all, as shown in FIGS. 1A to 1C, a lower resist film 53, an SOG film 54 and an upper resist film 55 are successively deposited on the surface of a working substrate (a substrate to be worked) such as a silicon substrate 51 bearing on the surface thereof with a silicon oxide film 52. Then, as shown FIGS. 1D to 1F, the upper resist film 55 is patterned to form an upper resist pattern 55a, which is then employed as a mask for successively etching the SOG film 54 and the lower resist film 53, thereby obtaining a multi-layer resist pattern.

However, this conventional method of forming a multi-layer resist pattern is accompanied with a problem that on the occasion of patterning the upper resist film 55, the dimension of the resultant upper resist pattern is caused to fluctuate depending on the changes in thickness of the SOG film 54.

By the way, in the ordinary lithography process, an inspection for checking the dimension of pattern and also an inspection for checking the relative position between the present pattern and the pattern formed in a previous step are performed. When the resist pattern thus formed is found as being off-specification in these inspections, the lithography process is required to be redone.

If the lithography process is redone due to the off-specification of the pattern in the conventional method of forming a multi-layer resist pattern, it is required at first to remove the upper resist pattern 55a/the SOG film 54a/the lower resist film 53a in stepwise and by a suitable treatment adjusted for each film. This re-work of lithography process however is very troublesome.

Meanwhile, there is also known another conventional method for forming a multi-layer resist pattern, which is featured in the employment of a two-layer structure instead of the aforementioned three-layer structure, wherein Si is incorporated into the upper resist layer to thereby enhancing the etching resistance thereof relative to the lower resist layer.

According to this method, since the upper resist pattern can be directly formed on the surface of the lower resist layer, the SOG film is no longer required to be formed. Therefore, the problem of the fluctuation of dimension which is accompanied with the aforementioned three-layer structure can be overcome by the employment of this two-layer structure. However, the aforementioned problem of troublesome re-work of lithography process will be still left remained when the pattern is found defective.

Additionally, when the content of Si is increased for providing the upper resist layer with a sufficient etching resistance relative to the lower resist layer, the lithography characteristic, typically the resolution, of the upper resist layer would be frequently deteriorated, resulting in an increase of dimensional error of pattern.

As explained above, the conventional method of forming a three-layer resist pattern is accompanied with the problems that the dimension of the upper resist pattern may be caused to fluctuate due to the effect of SOG film underlying beneath the upper resist pattern, and that the re-work of lithography process in this three-layer structure becomes very troublesome.

The conventional method of forming a two-layer resist pattern, on the other hand, is accompanied with the problems that when it is desired to provide the upper resist layer with a sufficient etching resistance relative to the lower resist layer, the lithography characteristic of the upper resist layer is caused to deteriorate, resulting in an increase of dimensional error of pattern.

BRIEF SUMMARY OF THE INVENTION

According to the present invention, there is provided a method of forming a pattern, which comprises:

forming a first resist film on a surface of a substrate;

patterning the first resist film to form a first resist pattern; and forming a covering layer containing silicon or a metal on the first resist pattern by making use of a coating method using a solution containing a solvent which is incapable of dissolving the first resist.

Further, according to the present invention, there is also provided a method of forming a pattern, which comprises:

forming a first resist film on a surface of a substrate;

patterning the first resist film to form a first resist pattern;

forming a covering layer containing silicon or a metal on a surface of the first resist pattern by making use of a coating method using a solution containing a solvent which is incapable of dissolving the first resist; and wet-etching a surface of the covering layer until a surface of the first resist pattern is exposed, thereby allowing the covering film to be selectively left remain in an opened portion of the first resist pattern;

wherein the forming of the covering layer and the step of wet-etching are continuously performed by making use of an apparatus provided with a coater and a wet etcher.

Still further, according to the present invention, there is also provided a method of manufacturing a semiconductor device, which comprises:

forming a first resist film on a surface of a substrate;

patterning the first resist film to form a first resist pattern; and forming a covering layer containing silicon or a metal on the first resist pattern by making use of a coating method using a solution containing a solvent which is incapable of dissolving the first resist.

DETAILED DESCRIPTION OF THE INVENTION

Figure 1A:
FIGS. 1A to 1F respectively show cross-sectional views illustrating in step-wise the process of forming a multi-layer resist pattern according to the prior art.
Figure 1B:
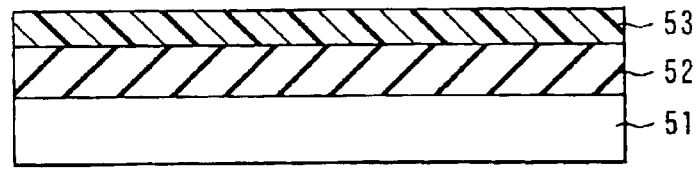
Figure 1C:
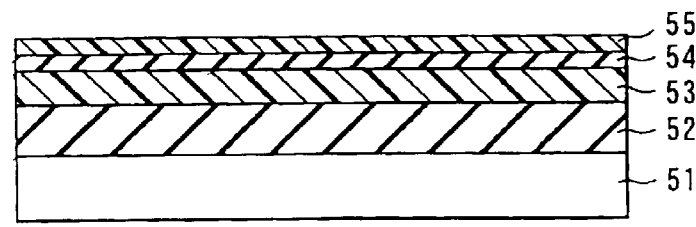
Figure 1D:
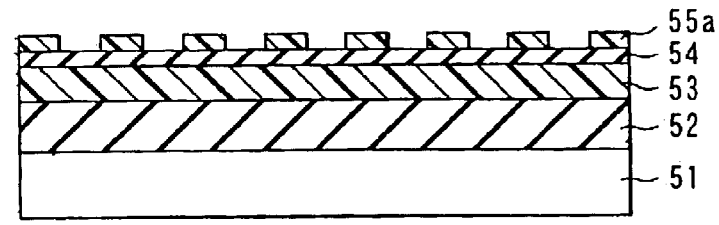
Figure 1E:
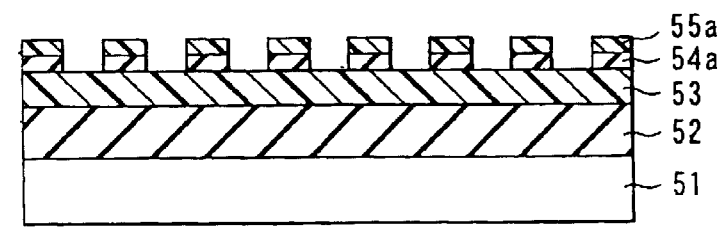
Figure 1F:
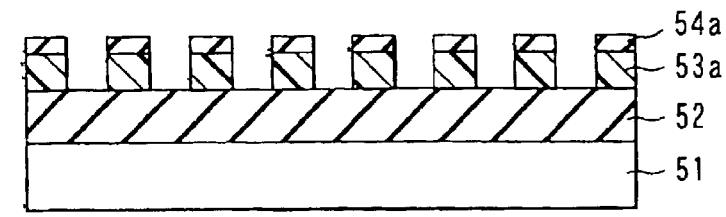

A first aspect of the method of the present invention is featured in that a covering layer containing silicon or a metal is formed on a first resist pattern by making use of a coating method using a solution containing a solvent which is incapable of dissolving the first resist.

The method of forming a pattern according to this first aspect of the present invention may further comprise the following specific constituents.

(1) The covering film contains one kind of element selected from the group consisting of silicon, Al and Ti.

(2) The covering film contains one kind of material selected from the group consisting of a water-soluble polymer containing silicon, a water-soluble polymer containing alumina and a water-soluble polymer containing titania.

(3) The water-soluble polymer containing silicon comprises polysilsesquioxane or a water-soluble spin-on glass.

(4) The solvent which is incapable of dissolving the first resist is at least one kind of material selected from the group consisting of water, alcohol, anisole and aliphatic hydrocarbon.

(5) The method further comprises heating the covering layer.

(6) The method further comprises forming a second resist film on the working substrate prior to the forming of the first resist film.

(7) The method of aforementioned item (6) further comprises:
etching or polishing the surface of the covering layer until the surface of the first resist pattern is exposed, thereby allowing said covering film to be selectively left remain in an opened portion of the first resist pattern; and
etching the first resist pattern and the second resist pattern with the residual covering layer being employed as a mask to thereby form a second resist pattern.

(8) The surface of the covering layer is etched by means of reactive ion etching method, or polished by means of chemical mechanical polishing method.

(9) The surface of the covering layer is wet-etched by making use of one kind of material selected from the group consisting of water, an acidic aqueous solution and an alkaline aqueous solution.

A second aspect of the method of the present invention is featured in that the forming of the covering layer and the wet-etching are continuously performed by making use of an apparatus provided with a coater and a wet etcher.

The method of forming a pattern according to this second aspect of the present invention may further comprise the following specific constituents.

(1) The covering film contains one kind of element selected from the group consisting of silicon, Al and Ti.

(2) The covering film contains one kind of material selected from the group consisting of a water-soluble polymer containing silicon, a water-soluble polymer containing alumina and a water-soluble polymer containing titania.

(3) The water-soluble polymer containing silicon comprises polysilsesquioxane or a water-soluble spin-on glass.

(4) The solvent which is incapable of dissolving the first resist is at least one kind of material selected from the group consisting of water, alcohol, anisole and aliphatic hydrocarbon.

(5) The method further comprises heating the covering layer.

(6) The method further comprises forming a second resist film on the working substrate prior to the forming of the first resist film.

(7) The method of aforementioned item (6) further comprises etching the first resist pattern and the second resist pattern with the residual covering layer being employed as a mask to thereby form a second resist pattern.

(8) The surface of the covering layer is wet-etched by making use of one kind of material selected from the group consisting of water, an acidic aqueous solution and an alkaline aqueous solution.

Next, the methods of forming a pattern according to a first and a second embodiments of the present invention will be explained in details.

First of all, a novolac type MUV resist is spin-coated on a working substrate made of a silicon substrate or a silicon substrate bearing thereon a silicon oxide film. Then, the resultant resist layer is baked to form an underlying resist film (a second resist film) having a thickness ranging from 300 to 900 nm, e.g. a thickness of 500 nm. By the way, this underlying resist film may not be formed in some instances.

Next, a DUV resist is spin-coated on the surface of this underlying resist film, and then, baked to form an upper resist film (a first resist film). Then, this upper resist film is subjected to exposure and development processes to thereby form an upper resist pattern (a first resist pattern) having a thickness ranging from 100 to 400 nm, e.g. a thickness of 200 nm and a line width ranging from 0.11 to 0.25 μm, e.g. a thickness of 0.15 μm. The patterning exposure of the upper resist film may be performed using KrF excimer laser for instance.

Subsequently, a aqueous polymer solution containing silicon and/or a metal is coated on the upper resist pattern and baked to thereby form a polymer film having a film thickness ranging from 100 to 400 nm, e.g. a thickness of 200 nm (hereinafter, referred to as a silicon-containing polymer film).

As for the silicon-containing polymer film, it is possible to employ polysilsesquioxane for instance. Since polysilsesquioxane is water-soluble, it can be coated as an aqueous solution by a coating method, and hence the coated film can be etched by making use of water or an aqueous solution. Further, the film thus formed can be employed as an etching mask for an organic film such as a resist film. As for the metal to be included in the polymer, it may be selected from titanium and aluminum.

As for the coating method of an aqueous solution of the silicon-containing polymer, a scan-coating method can be employed other than the spin-coating method. In contrast to the spin-coating method where a coated film is formed while rotating a substrate, this scan-coating method is a method wherein an aqueous solution of the silicon-containing polymer is dropped from a nozzle while the nozzle is scanned back and forth over a stationary substrate. It is possible with this scan-coating method to obtain a homogeneous coated film which is free from defects even on a resist pattern having a stepped portion.

Then, the surface of the silicon-containing polymer film is wet-etched using water or, an acidic or alkaline aqueous solution in such a manner that the silicon-containing polymer film can be left remain only in a recessed portion of the resist pattern. This etching may be performed until the top surface of the resist pattern is allowed to expose. In this manner, a silicon-containing polymer film pattern can be formed.

In this case, according to the second embodiment of the present invention, by making use of a track (a resist coating/developing device) which is generally employed in a lithography process, the coating and baking steps of the silicon-containing polymer film as well as the wet-etching step of the silicon-containing polymer film can be performed continuously in the same apparatus.

Then, by means of a reactive ion etching (RIE) method using an oxygen-containing gas, the upper resist pattern as well as the underlying lower resist film can be etched using the silicon-containing polymer film pattern as a mask.

It is possible in this manner to obtain a mask pattern consisting of a silicon-containing polymer film pattern and a lower resist film, and having a reversed pattern of an upper resist pattern and a high aspect ratio.

It is possible, according to the first and second embodiments of the present invention, to perform the etching of the surface of the covering layer until the surface of the first resist pattern is exposed, to allow the covering film to be selectively left remain in an opened portion of the first resist pattern, and to simultaneously etch the first resist pattern and the second resist pattern with the residual covering layer left remained in a recessed portion of the first resist pattern being employed as a mask. As a result, it is no longer required to adopt a complicated three-layer structure (an lower resist layer/an SOG layer/an upper resist layer) such as the conventional three-layer resist process. Further, the addition of Si to the first resist layer which has been considered as being one of the causes for deteriorating the resolution in the conventional two-layer resist process can be dispensed with. Therefore, it is possible, according to the first and second embodiments of the present invention, to minimize the dimensional error and to simplify the re-work process.

In particular, according to the second embodiment of the present invention, the etching of a silicon-containing polymer film can be performed while making the controllability thereof very simple and using a wet etching which is relatively low in cost. At the same time, it is possible, according to the second embodiment of the present invention, to continuously perform a sequence of processes, i.e. from the coating of a silicon-containing polymer film up to the wet etching step in the same apparatus. As a result, it is possible according to the method of the present invention to save the manufacturing cost and to greatly improve the throughput and productivity as compared with the conventional reversal multi-layer resist process where a silicon-containing polymer film is etched by means of the RIE method or CMP method employing a fluorine-based gas.

Further, it is possible to optionally change the etching rate by suitably selecting the baking condition of a silicon-containing polymer film as well as the wet etching treatment solution. Therefore, the magnitude of etching of a silicon-containing polymer film can be easily controlled, thus making it possible to accurately control the dimension of pattern.

By the way, it is possible according to the method of the present invention to form an intermediate layer consisting of an organic polymer on the surface of the lower resist layer (second resist layer) prior to the deposition of the upper resist layer (first resist layer).

Next, examples of the present invention will be explained with reference to the drawings.

EXAMPLE 1

FIGS. 2A to 2F respectively show cross-sectional views illustrating in step-wise the process of forming a multi-layer resist pattern according to Example 1 of the present invention.

Figure 2A:
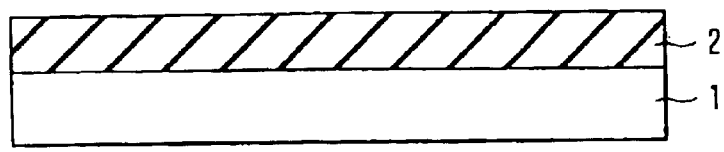
FIGS. 2A to 2F respectively show cross-sectional views illustrating in step-wise the process of forming a multi-layer resist pattern according to Examples 1 and 2 of the present invention.

First of all, as shown in FIG. 2A, a working substrate comprising a silicon substrate 1 and a silicon oxide film 2 having a thickness of 1 $\mu$m and formed on the silicon substrate 1 was prepared. This silicon oxide film 2 is designed to be employed as an interlayer insulating film.

Figure 2B:
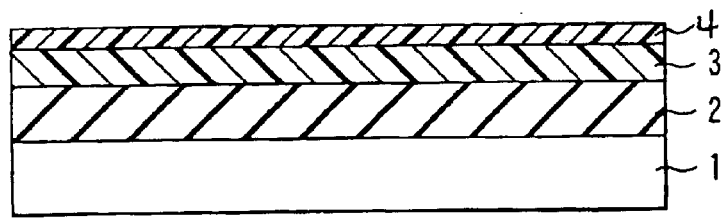

Then, as shown in FIG. 2B, a solution of poly(2,6-biphenylylene ethylene) (Mw=10000, hereinafter, referred to as polyarylene) in cyclohexanone solvent (solid matter= 10 wt %) was coated on the surface of the silicon oxide film 2 by means of spin-coating method (one of casting method) at a revolving speed of 3000 rpm, thereby forming a layer, which was then spin-dried to form a 900 nm-thick lower resist (polyarylene film: a first film) 3 on the surface of the silicon oxide film 2. Then, a coated film (an upper resist layer: a second film) 4 consisting of a chemical amplification type positive resist (JSR KrF M20G) (film thickness: 200 nm) was formed on the surface of the lower resist layer 3.

Figure 2C:
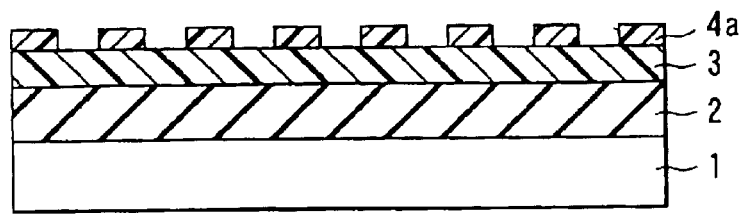

Then, as shown in FIG. 2C, the coated film 4 was subjected to an exposure process using a half-tone mask having a permeability of 6% and using a KrF excimer exposure device (NSRS203B: Nikon Co., Ltd.) under the conditions of: NA=0.68; $\sigma$=0.75; $\frac{2}{3}$ annular illumination; and exposure dose=17 mJ/cm$^2$. Thereafter, the coated film 4 was subjected to a development process to thereby form an upper resist pattern 4a having a 0.13 $\mu$m L/S pattern.

Subsequently, an aqueous solution of polysilsesquioxane (solid matter: 6 wt %) was coated on the surface of the upper resist pattern 4a by means of spin-coating method at a revolving speed of 2500 rpm so as to form a 300 nm-thick layer, which was then heat-treated for 2 minutes at a temperature of 120° C. in the air atmosphere 40% in humidity.

Figure 2D:
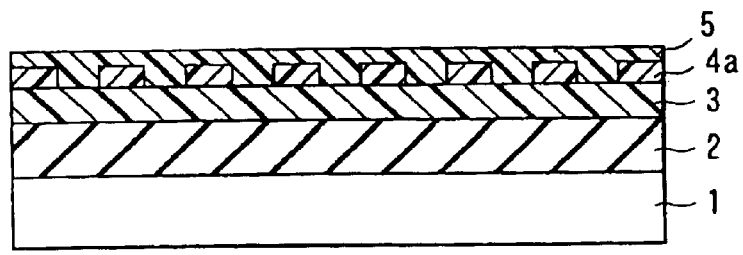

As a result, as shown in FIG. 2D, a polysilsesquioxane film 5 (a third film: a film of an organic silicon-based polymer) was formed over the lower resist layer 3 and the upper resist pattern 4a, the polysilsesquioxane film 5 having a flat top surface and a thickness sufficient to bury the recessed portion of the upper resist pattern 4a.

By the way, although a solvent containing water was employed as a casting solvent herein, it is possible to employ any kind of solvent as long as it contains at least one kind of material selected from the group consisting of water, alcohol, anisole and aliphatic hydrocarbon-based solvent. Further, although a film containing Si was employed as the third film herein, any kind of film can be employed as long as it contains at least one kind of element selected from the group consisting of Si, Al and Ti.

Figure 2E:
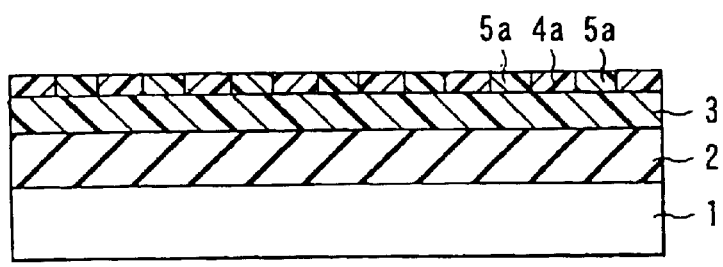

Then, as shown in FIG. 2E, by making use of a plasma consisting of a mixed gas of CF$_4$/O$_2$, the polysilsesquioxane film 5 was etched in a CDE (Chemical Dry Etching) apparatus until the surface of the upper resist pattern 4 was allowed to expose, thereby leaving the polysilsesquioxane film 5a only in the recessed portion of the upper resist pattern 4a.

The film thickness of the residual polysilsesquioxane film 5a after this etching step was about 100 nm. By the way, instead of the CDE method, it is also possible to selectively leave the polysilsesquioxane film 5a as described above by way of etch-back using a reactive ion etching method (RIE method) or by way of polishing using a chemical mechanical polishing method (CMP method).

Figure 2F:
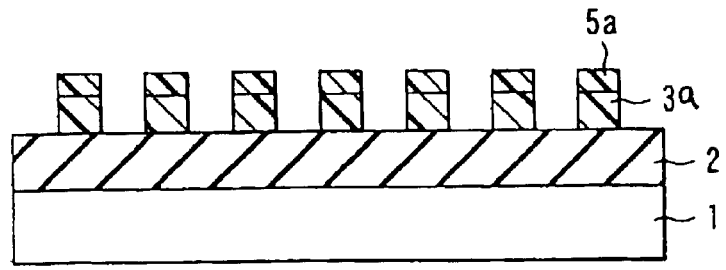

Finally, as shown in FIG. 2F, by making use of the polysilsesquioxane film 5a as a mask, the upper resist pattern 4a and the lower resist layer 3 were dry-etched in the RIE apparatus by making use of a plasma consisting of a mixed gas of $CF_4/O_2$, thereby forming a lower resist pattern 3a having a reversed pattern relative to the upper resist pattern 4a.

As a result, a multi-layered resist pattern consisting of the lower resist pattern 3a and the polysilsesquioxane film 5a was obtained. By the way, the film thickness of the polysilsesquioxane film 5a after this etching step was about 30 nm.

Further, the multi-layered resist pattern obtained after the above working was found high in aspect ratio and excellent in profile, and the dimension conversion difference (the dimension of the upper resist layer—the dimension of the lower resist layer after the etching) was found 5 nm or less.

This may be attributed to the fact that since the upper resist pattern 4a was formed prior to the formation of the polysilsesquioxane film 5 in this example, it was possible to prevent the upper resist pattern 4a from being influenced by the film thickness of the polysilsesquioxane film 5, thereby making it possible, as a result, to precisely control the dimension of the upper resist pattern 4a.

Additionally, since the resist pattern was formed by dry-etching the upper resist pattern 4a and the lower resist layer 3 with the polysilsesquioxane film 5a being employed as a mask in this example, it is no longer required to increase the content of Si in the upper resist pattern for the purpose of providing the upper resist pattern with a sufficient etching resistance on the occasion of etching the lower resist layer. As a result, the problem of the deterioration of lithographic characteristic, typically, the deterioration of the resolution of the upper resist layer can be overcome.

Next, one example where a pattern formed has been found as being off-specification as a result of the dimensional inspection thereof in the present invention and in the prior art, i.e. one example where the re-work of lithography is required will be explained.

First of all, since the polysilsesquioxane film 5 was not formed at the moment when the upper resist pattern 4a was to be formed in the method of the present invention, the upper resist pattern 4a and the lower resist layer 3 could be easily removed by treating them with a mixed solution consisting of sulfuric acid and hydrogen peroxide. Further, in this wet etching treatment, it was possible to apply a batch processing thereto. Namely, the time required for removing one lot (25 sheets) of the resist layer on the working substrate 1 was 30 minutes.

Whereas, on the occasion to remove a multi-layered resist pattern formed according to the prior art, since the SOG film which was insoluble to a mixed solution consisting of sulfuric acid and hydrogen peroxide was interposed between the lower resist layer and the upper resist layer, it was impossible to employ a resist-removing method utilizing the aforementioned wet treatment. Therefore, the upper resist layer was required to removed by making use of an oxygen-based gas, the SOG film was required to removed by making use of a fluorine-based gas, and the lower resist layer was required to removed by making use of an oxygen-based gas again, all in a sheeter type ashing apparatus and in stepwise. According to the method of this prior art, the time required for removing one lot (25 sheets) of the resist layer on the working substrate 1 was 100 minutes, i.e. twice the time required in the present example.

EXAMPLE 2

Next, the method of forming a multi-layer resist pattern according to Example 2 of the present invention will be explained.

Although the etching step of the polysilsesquioxane film 5 in FIG. 2E was performed by means of CDE method in Example 1, the etching of the polysilsesquioxane film 5 in this example was performed by a wet etching method using an aqueous solution of HF (hydrogen fluoride). As a result, the film thickness of the polysilsesquioxane film 5 after the wet etching step was about 60 nm which was almost the same as that obtained in the employment of the CDE.

Even in the employment of wet etching method, it was confirmed possible to obtain almost the same effects (decrease in dimension conversion difference, and simplification of re-work). By the way, the procedures of steps before and after the step of FIG. 2E were the same as those of Example 1.

EXAMPLE 3

FIGS. 3A to 3G respectively show cross-sectional views illustrating in step-wise the process of forming a multi-layer resist pattern according to Example 3 of the present invention.

Figure 3A:
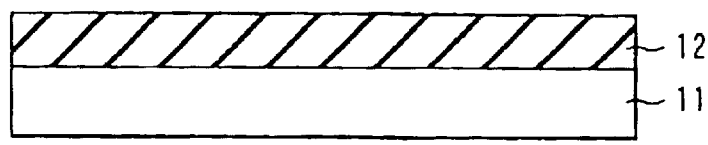
FIGS. 3A to 3G respectively show cross-sectional views illustrating in step-wise the process of forming a multi-layer resist pattern according to Example 3 of the present invention.

First of all, as shown in FIG. 3A, a working substrate comprising a silicon substrate 11 and a silicon oxide film 12 having a thickness of 1 μm and formed on the silicon substrate 11 was prepared.

Figure 3B:
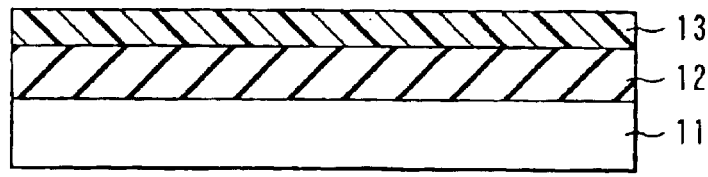

Then, as shown in FIG. 3B, a solution of polyacenaphthene (Mw=1500) in cyclohexanone solvent (solid matter=1 wt %) was coated on the surface of the silicon oxide film 12 so as to form a lower resist layer (polyacenaphthene film) 13 having a thickness of 500 nm on the surface of the silicon oxide film 12.

Figure 3C:
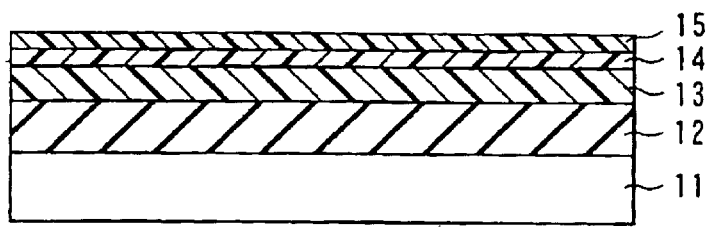

Then, as shown in FIG. 3C, a reflection preventive film AR5 for DUV (Shiplay Co., Ltd.) (hereinafter, referred to simply as a reflection preventive film) 14 was formed on the lower resist layer 13 by a coating method. On this occasion, the revolving speed and the condition for the baking were selected so as to control the thickness of the reflection preventive film 14 to 70 nm. Further, a coated film 15 consisting of a chemical amplification type positive resist (JSR KrF M20G) (an upper resist layer: a second film; film thickness=200 nm) was deposited on the surface of the reflection preventive film 14.

Figure 3D:
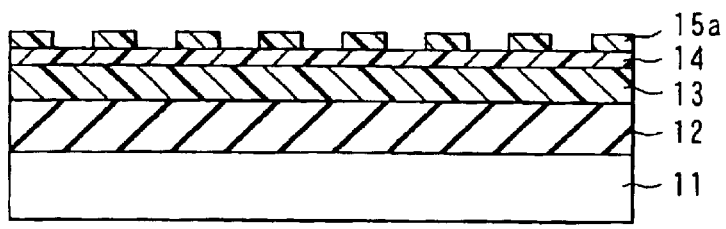

Then, as shown in FIG. 3D, the coated film 15 was subjected to an exposure process using a half-tone mask having a permeability of 6% and using a KrF excimer exposure device (NSRS203B: Nikon Co., Ltd.) under the conditions of: NA=0.68; σ=0.75; ⅔ annular illumination; and exposure dose=17 mJ/cm². Thereafter, the coated film 15 was subjected to a development process to thereby form an upper resist pattern 15a having a 0.13 μm L/S pattern.

The reflection preventive film 14 employed herein exhibited a reflection preventive effect to the DUV exposure light and also an effect to enhance the adhesivity between the lower resist layer 13 and the upper resist pattern 13.

Figure 3E:
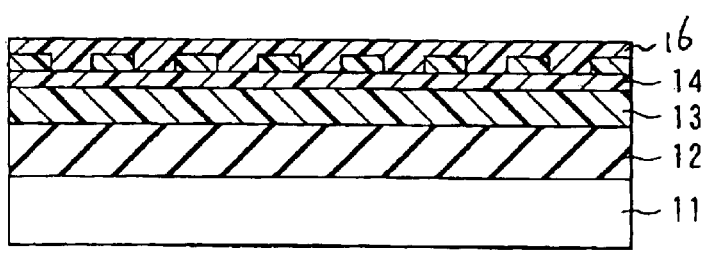

Then, as shown in FIG. 3E, a polysilsesquioxane film 16 having a thickness of 300 nm was formed over the lower resist layer 13 and the upper resist pattern 15a, the polysilsesquioxane film 16 having a flat top surface and a thickness sufficient to bury the recessed portion of the upper resist pattern 15a.

By the way, while the polysilsesquioxane film 5 was formed by means of a spin-coating method in Example 1, the polysilsesquioxane film 16 was formed by means of a scanning coating method in this Example 3. Due to the employment of this scanning coating method, it was possible to obtain a uniformly coated film which was free from defective even on a resist pattern having stepped portions.

Figure 3F:
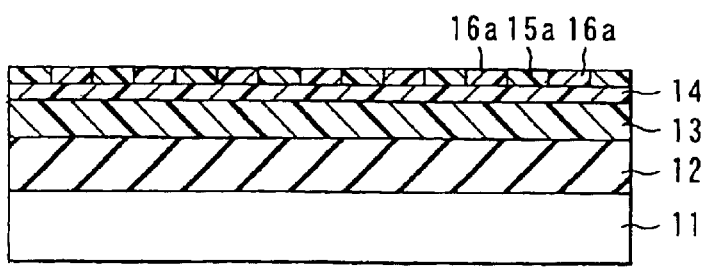

Then, as shown in FIG. 3F, in the same manner as in Example 1, by making use of a plasma consisting of a mixed gas of $CF_4/O_2$, the polysilsesquioxane film 16 was etched in a CDE apparatus, thereby leaving the polysilsesquioxane film 16a only in the recessed portion of the upper resist pattern 14a. This step may be performed by means of a wet etching method in the same manner as in Example 2.

Figure 3G:
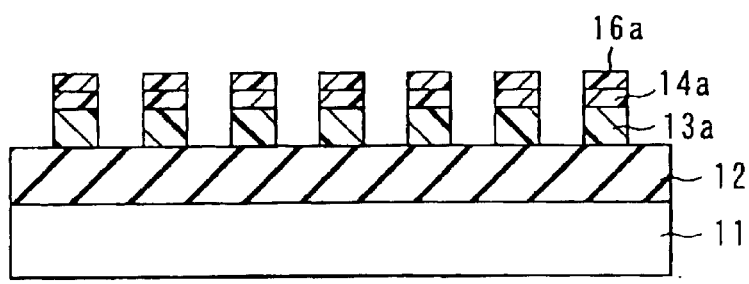

Finally, as shown in FIG. 3G, by making use of the polysilsesquioxane film 16a as a mask as in the case of Example 1, the upper resist pattern 15a, the reflection preventive film 14 and the lower resist layer 13 were dry-etched in the RIE apparatus by making use of a plasma consisting of a mixed gas of $N_2/O_2$, thereby forming a lower resist pattern 13a having a reversed pattern relative to the upper resist pattern 15.

As a result, a multi-layered resist pattern consisting of the lower resist pattern 13a, the reflection preventive film 14a and the polysilsesquioxane film 16a was formed.

The multi-layered resist pattern obtained after the above working was found high in aspect ratio and excellent in profile, and the dimension conversion difference (the dimension of the upper resist layer—the dimension of the lower resist layer after the etching) was found very small. Even though the reflection preventive film 14 is allowed to exist, since this reflection preventive film 14 can be easily removed, the re-work of the lithography process would be more simple as compared with the conventional method.

According to the aforementioned Examples 1 to 3, the step of forming a polymer film by means of coating, and the step of etching the polymer film by means of the RIE or CMP method are required to be performed by making use of a couple of different apparatuses. As a result, the problem of the deterioration of lithographic characteristic, typically, the deterioration of the resolution of the upper resist layer can be overcome. As a result, the manufacturing process may become complicated, and hence the productivity may be deteriorated.

Moreover, since the etching rate of a polymer film containing silicon or metal is very high under the RIE condition using a fluorine-based gas, it becomes very difficult to delicately control the degree of etching, thereby possibly deteriorating the dimensional accuracy of the mask pattern to be ultimately obtained.

Following Examples 4 to 7 are designed to solve the aforementioned problems.

EXAMPLE 4

The process of forming a pattern according to Example 4 of the present invention will be explained with reference to FIGS. 4A to 4D.

Figure 4A:
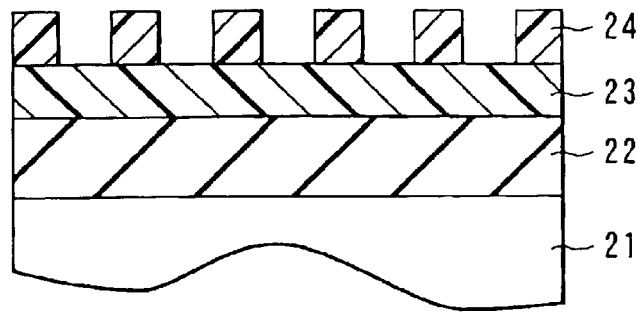
FIGS. 4A to 4D respectively show cross-sectional views illustrating in step-wise the process of forming a multi-layer resist pattern according to Examples 4–7 of the present invention.
Figure 4B:
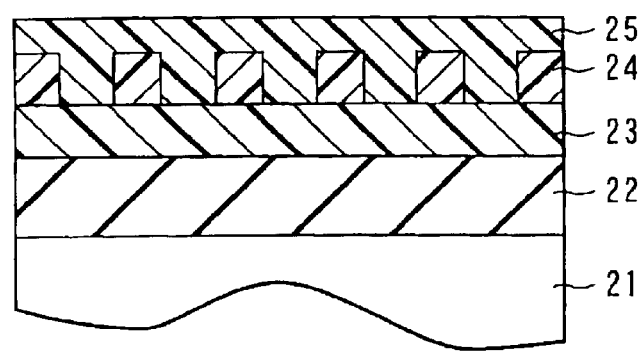

First of all, as shown in FIG. 4A, a silicon oxide film 22 having a thickness of 1 $\mu$m was formed as a working film (a film to be worked) on the surface of a silicon substrate 1.

Then, a solution of poly(2,6-biphenylylene ethylene) (Mw=10000, hereinafter, referred to as polyarylene) in cyclohexanone solvent (solid matter=10 wt %) was coated on the surface of the silicon oxide film 22 by means of spin-coating method to thereby form a layer, which was then spin-dried to form a lower resist layer 23 on the surface of the silicon oxide film 22. This spin-coating was performed at a revolving speed of 3000 rpm so as to obtain a 900 nm-thick film as the lower resist layer 23 was to be formed as a single layer.

Then, a coated film consisting of a chemical amplification type positive resist (JSR KrF M20G) (film thickness: 200 nm) was formed on the surface of the lower resist layer 23 formed of the aforementioned polyarylene film. Then, the coated film was subjected to an exposure process using a half-tone mask having a permeability of 6% and using a KrF excimer exposure device (NSRS203B: Nikon Co., Ltd.) under the conditions of: NA=0.68; $\sigma$=0.75; $\frac{2}{3}$ annular illumination, the exposure being designed to form a 0.13 $\mu$m L/S pattern. Thereafter, the coated film was subjected to development process to thereby form an upper resist pattern 24. By the way, the exposure dose in the aforementioned exposure process was 17 $mJ/cm^2$.

Subsequently, an aqueous solution of polysilsesquioxane (solid matter: 6 wt %) was coated on the surface of the upper resist pattern 24 by means of spin-coating method at a revolving speed of 2500 rpm so as to form a 300 nm-thick layer, which was then baked for 2 minutes at a temperature of 80° C. to form a polysilsesquioxane film 25 having a thickness sufficient to bury the recessed portion of the upper resist pattern 24.

Figure 5A:
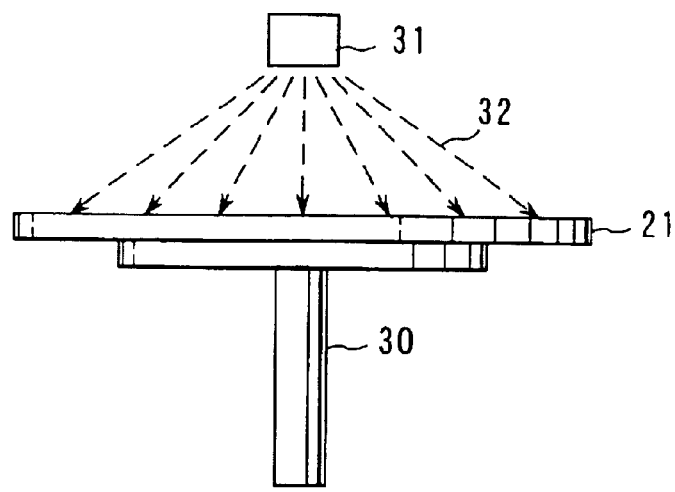
FIGS. 5A and 5B respectively show cross-sectional views illustrating a wet etching system which has been employed in an example of the present invention.

Subsequently, by making use of the apparatus shown in FIG. 5A, the surface of the polysilsesquioxane film 25 was etched by spraying a 2.38% aqueous solution of tetramethylammonium hydroxide (TMAH) 32 from a spray type nozzle 31 while rotating the silicon substrate 21 at a revolving speed of 500 rpm by means of a spin-chuck 30.

Figure 4C:
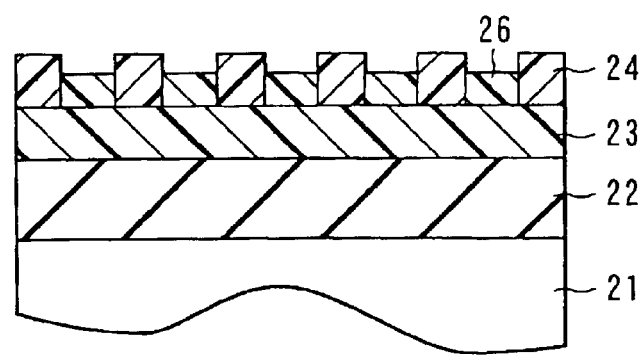

This etching was continued until the surface of the upper resist pattern 24 was exposed, taking 45 seconds for this etching. As a result, as shown in FIG. 4C, the polysilsesquioxane film was left remained only in the recessed portion of the upper resist pattern 24, thereby forming a polysilsesquioxane film pattern 26.

In this case, a sequence of steps, i.e. from the step of forming the polysilsesquioxane film 25 to the step of etching the polysilsesquioxane film 25 by making use of an aqueous solution of TMAH was continuously performed by making use of an apparatus comprising a spin coater unit 41 provided with a nozzle for dropping a solution of polysilsesquioxane, a baking unit 42 provided with an infrared-irradiating means for heating the polysilsesquioxane film, and a spray unit 43 provided with a spray means for spraying an aqueous solution of TMAH, such as a resist coating/developing apparatus (Clean Track Act8: Tokyo Electron Co., Ltd.).

As a result, it was possible to treat 25 sheets of the substrate within 30 minutes. Whereas, when the etching of the polysilsesquioxane film 25 was performed by means of RIE method, a time period of as long as 50 minutes or more was required for treating 25 sheets of the substrate, because the formation and baking of the polysilsesquioxane film 25 was required to be performed using a clean track, while the etching thereof was required to be separately performed using an RIE apparatus.

Figure 4D:
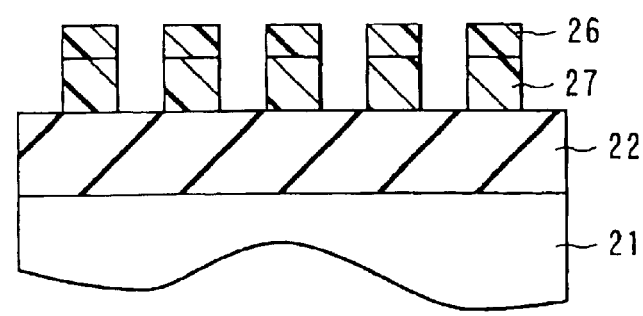

Then, by making use of the resultant polysilsesquioxane film pattern 26 as a mask, the upper resist pattern 24 was dry-etched in the RIE apparatus by making use of a plasma consisting of a mixed gas of $N_2/O_2$, thereby forming a lower resist pattern 27 having a reversed pattern relative to the upper resist pattern 24 as shown in FIG. 4D.

The lower resist pattern 27 thus obtained was found high in aspect ratio and excellent in profile, and the dimension conversion difference (the dimension of the upper resist layer—the dimension of the lower resist layer after the etching) was found 5 nm or less. By the way, the residual film thickness of the polysilsesquioxane pattern 26 after this etching step of resist was about 30 nm.

EXAMPLE 5

Example 5 of the present invention will be explained with reference to FIGS. 4A to 4D.

First of all, as shown in FIG. 4A, a silicon oxide film 22 having a thickness of 1 μm was formed as a working film on the surface of a silicon substrate 1.

Then, in the same manner as in Example 4, a lower resist layer 23 made of polyarylene was formed on the surface of a silicon oxide film 22. Then, by making use of a chemical amplification type positive resist (JSR KrF M20G) (film thickness: 200 nm), an upper resist pattern 24 having a 0.13 μm L/S pattern was formed.

Thereafter, by making use of a clean track provided with a resist-coating unit which was capable of executing the scan coating method, a polysilsesquioxane film 25 having a thickness of 300 nm was formed by means of the scan coating method.

It was possible with this scan-coating method to obtain a homogeneous polys bilsesquioxane film 25 which was free from defects even on a resist pattern 24 having a stepped portion.

Figure 5B:
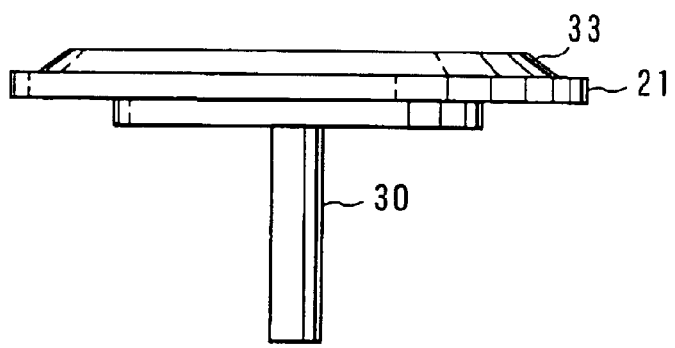

Then, by making use of a developing unit mounted inside the same clean track, the polysilsesquioxane film 25 bearing a liquid film 33 consisting of pure water on the surface thereof was left to stand for 60 seconds as shown in FIG. 5B, thereby allowing the polysilsesquioxane film 25 to be etched until the surface of the upper resist pattern 24 was allowed to expose, thus forming a polysilsesquioxane film pattern 26.

In contrast with Example 4, the baking after the formation of polysilsesquioxane film 25 was not performed in this example. Namely, a sequence of steps, i.e. from the step of forming the polysilsesquioxane film 25 to the step of etching the polysilsesquioxane film 25 by making use of pure water was continuously performed using the scan coater unit instead of the spin coater unit 41, without using the baking unit 42, and using an apparatus shown in FIG. 5B in place of the spray unit 43.

Then, by making use of the resultant polysilsesquioxane film pattern 26 as a mask, the upper resist pattern 24 was dry-etched in the RIE apparatus by making use of a plasma consisting of a mixed gas of $N_2/O_2$, thereby forming a lower resist pattern 27 having a reversed pattern relative to the upper resist pattern 24.

The lower resist pattern 27 thus obtained was found high in aspect ratio and excellent in profile, and the dimension conversion difference (the dimension of the upper resist layer—the dimension of the lower resist layer after the etching) was found sufficiently minimum.

EXAMPLE 6

Example 6 of the present invention will be explained with reference to FIGS. 4A to 4D.

First of all, as shown in FIG. 4A, a silicon oxide film 22 having a thickness of 1 μm was formed as a working film on the surface of a silicon substrate 1.

Then, in the same manner as in Example 4, a lower resist layer 23 made of polyarylene was formed on the surface of a silicon oxide film 22. Then, a solution of polyacenaphthene (Mw=2500) in cyclohexanone solvent (solid matter=1 wt %) was coated on the surface of the silicon oxide film 22 so as to form a lower resist layer 23 having a thickness of 500 nm. Then, by making use of a chemical amplification type positive resist (JSR KrF M20G) (film thickness: 200 nm), an upper resist pattern 24 having a 0.13 μmL/S pattern was formed on the surface of the lower resist layer 23.

Then, by making use of a clean track (Tokyo Electron Co., Ltd.), the step of scan-coating an aqueous solution of polyacenaphthene (200 nm in thickness), the step of baking treatment (100° C. for 30 seconds), and the step of wet etching were continuously performed to thereby form a polysilsesquioxane film pattern 26. In this example, a 2 wt % aqueous solution of acetic acid was employed as a wet etching treatment solution, and the spray system employed in Example 4 was employed as a liquid-feeding system.

Figure 6:
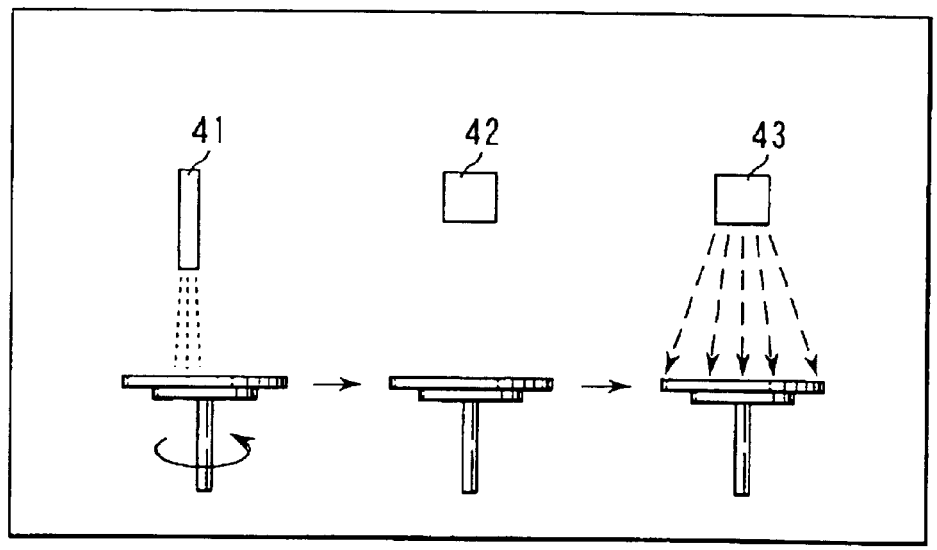
FIG. 6 schematically illustrates an apparatus provided with a spin coater, a baking unit and a spray unit, which has been employed in Examples 4–7 of the present invention.

Namely, a sequence of steps, i.e. from the step of forming the polysilsesquioxane film 25 to the step of etching the polysilsesquioxane film 25 by making use of an aqueous solution of acetic acid was continuously performed by making use of the apparatus shown in FIG. 6, which was provided with a scan coater unit in place of the spin coater unit 41.

Then, by making use of the polysilsesquioxane film pattern 26 left remained in the recessed portion of the upper resist pattern 24 as a mask, the upper resist pattern 24 was dry-etched in the RIE apparatus by making use of a plasma consisting of a mixed gas of $N_2/O_2$, thereby forming a lower resist pattern 27 having a reversed pattern relative to the upper resist pattern 24.

Just like the resist patterns obtained in Examples 4 and 5, the lower resist pattern 27 thus obtained was found high in aspect ratio and excellent in profile, and the dimension conversion difference (the dimension of the upper resist layer—the dimension of the lower resist layer after the etching) was found extremely minimum.

EXAMPLE 7

The process of forming a pattern according to Example 7 of the present invention will be explained with reference to FIGS. 4A to 4D.

First of all, as shown in FIG. 4A, a silicon oxide film 22 having a thickness of 1 μm was formed as a working film on the surface of a silicon substrate 1.

Then, a solution of poly(2,6-biphenylylene ethylene) (Mw=10000, hereinafter, referred to as polyarylene) in cyclohexanone solvent (solid matter=10 wt %) was coated on the surface of the silicon oxide film 22 by means of spin-coating method to thereby form a layer, which was then spin-dried to form a lower resist layer 23 on the surface of the silicon oxide film 22. This spin-coating was performed at a revolving speed of 3000 rpm so as to obtain a 900 nm-thick film as the lower resist layer 23 was to be formed as a single layer.

Then, a coated film consisting of a chemical amplification type positive resist (JSR KrF M20G) (film thickness: 200 nm) was formed on the surface of the lower resist layer 23 formed of the aforementioned polyarylene film. Then, the coated film was subjected to an exposure process using a half-tone mask having a permeability of 6% and using a KrF excimer exposure device (NSRS203B: Nikon Co., Ltd.) under the conditions of: NA=0.68; σ=0.75; ⅔ annular illumination, the exposure being designed to form a 0.13 μm L/S pattern. Thereafter, the coated film was subjected to a development process to thereby form an upper resist pattern 24. By the way, the exposure dose in the aforementioned exposure process was 17 mJ/cm².

Subsequently, an aqueous solution of water-soluble polymer containing Ti or Al (solid matter: 5 wt %) was coated on the surface of the upper resist pattern 24 by means of spin-coating method at a revolving speed of 2500 rpm so as to form a 300 nm-thick layer, which was then baked for 2 minutes at a temperature of 80° C. to form a water-soluble polymer film 25 having a thickness sufficient to bury the recessed portion of the upper resist pattern 24.

Subsequently, by making use of the apparatus shown in FIG. 5A, the surface of the polysilsesquioxane film 25 was etched by spraying a 2.38% aqueous solution of tetramethylammonium hydroxide (TMAH) 32 from a spray type nozzle 31 while rotating the silicon substrate 21 at a revolving speed of 500 rpm by means of a spin-chuck 30.

Namely, a sequence of steps, i.e. from the step of forming the polysilsesquioxane film 25 to the step of etching the polysilsesquioxane film 25 by making use of an aqueous solution of acetic acid was continuously performed by making use of the apparatus shown in FIG. 6.

This etching was continued until the surface of the upper resist pattern 24 was exposed, taking 45 seconds for this etching. As a result, as shown in FIG. 4C, the water-soluble polymer film was left remained only in the recessed portion of the upper resist pattern 24, thereby forming a water-soluble polymer film pattern 26.

In this case, a sequence of steps, i.e. from the step of forming the water-soluble polymer film 25 to the step of etching the water-soluble polymer film 25 by making use of an aqueous solution of TMAH was continuously performed by making use of an apparatus comprising a spin coater unit, a baking unit and a spray unit, such as a resist coating/developing apparatus (Clean Track Act8: Tokyo Electron Co., Ltd.).

As a result, it was possible to treat 25 sheets of the substrate within 30 minutes. Whereas, when the etching of the water-soluble polymer film 25 was performed by means of RIE method, a time period of as long as 50 minutes or more was required for treating 25 sheets of the substrate, because the formation and baking of the water-soluble polymer film 25 was required to be performed using a clean track, while the etching thereof was required to be separately performed using an RIE apparatus.

Then, by making use of the resultant water-soluble polymer film pattern 26 as a mask, the upper resist pattern 24 was dry-etched in the RIE apparatus by making use of a plasma consisting of a mixed gas of $N_2/O_2$, thereby forming a lower resist pattern 27 having a reversed pattern relative to the upper resist pattern 24 as shown in FIG. 4D.

The lower resist pattern 27 thus obtained was found high in aspect ratio and excellent in profile, and the dimension conversion difference (the dimension of the upper resist layer—the dimension of the lower resist layer after the etching) was found 5 nm or less. By the way, the residual film thickness of the water-soluble polymer film pattern 26 after this etching step of resist was about 30 nm.

By the way, the present invention should not be construed as being limited to the above examples. For example, although a silicon substrate bearing a silicon oxide film (working film) thereon was employed as a working substrate in the above examples, the working film may be other kinds of film such as a polycrystalline silicon film, a metal film, etc., which is adapted to be employed as a gate electrode. Further, the working film is not limited to a monolayer film, but may be for instance a laminate film comprising a polysilicon film and a W film, which is adapted to be employed as a gate electrode. Further, the working substrate may be a substrate per se. As for the step where a working substrate is turned into a substrate, a step of forming an element isolation trench or a trench capacitor will be exemplified.

Furthermore, the semiconductor substrate may not be limited to a silicon substrate. For example, the semiconductor substrate may be an SOI substrate, or any other kinds of semiconductor substrate other than silicon substrate.

Although a KrF excimer laser apparatus was employed as a light source in the above examples, it is possible according to the present invention to employ an ArF, Xe or F2 excimer laser apparatus.

The present invention may be variously modified without departing from the scope of the present invention.

Additional advantages and modifications will readily occur to those skilled in the art. Therefore, the invention is its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a pattern, comprising:
   forming a lower resist film over a surface of a substrate;
   forming an upper resist film on the lower resist film, said upper resist film being insoluble in water;
   patterning the upper resist film to form an upper resist pattern;
   forming a covering layer containing silicon or a metal on the upper resist pattern by a coating method using an aqueous solution of a water-soluble polymer containing silicon or a metal;
   etching or polishing a surface of the covering layer until a surface of the upper resist pattern is exposed, thereby allowing the covering layer to selectively remain in an open portion of the upper resist pattern; and
   etching the upper resist pattern and the lower resist film to form a lower resist pattern, using the covering layer remaining in the open portion as a mask.

2. The method according to claim 1, wherein said covering film contains one selected from the group consisting of silicon, Al, and Ti.

3. The method according to claim 2, wherein said covering film contains one selected from the group consisting of a water-soluble polymer containing silicon, a water-soluble polymer containing alumina and a water-soluble polymer containing titania.

4. The method according to claim 3, wherein said water-soluble polymer containing silicon comprises polysilsesquioxane or a water-soluble spin-on glass.

5. The method according to claim 1, which further comprises heating the covering layer.

6. The method according to claim 1, wherein said surface of the covering layer is etched by means of reactive ion etching method, or polished by chemical mechanical polishing method.

7. The method according to claim 1, wherein said surface of the covering layer is wet-etched by making use of one selected from the group consisting of water, an acidic aqueous solution, and an alkaline aqueous solution.

8. The method according to claim 1, wherein said covering film contains one selected from the group consisting of silicon, Al, and Ti.

9. The method according to claim 8, wherein said covering film contains one selected from the group consisting of a water-soluble polymer containing silicon, a water-soluble polymer containing alumina and a water-soluble polymer containing titania.

10. The method according to claim 9, wherein said water-soluble polymer containing silicon comprises polysilsesquioxane or a water-soluble spin-on glass.

11. The method according to claim 1, which further comprises heating the covering layer.

12. The method according to claim 1, wherein said surface of the covering layer is wet-etched by making use of one selected from the group consisting of water, an acidic aqueous solution, and an alkaline aqueous solution.

13. A method of forming a pattern, comprising:
    forming a lower resist film over a surface of a substrate;
    forming an upper resist film on the lower resist film, said upper resist film being insoluble in water;
    patterning the upper resist film to form an upper resist pattern;
    forming a covering layer containing silicon or a metal on the upper resist pattern by a coating method using an aqueous solution of a water-soluble polymer containing silicon or a metal;
    wet-etching a surface of the covering layer until a surface of the upper resist pattern is exposed, thereby allowing the covering layer to selectively remain in an open portion of the upper resist pattern; and
    etching the upper resist pattern and the lower resist film to form a lower resist pattern, using the covering layer remaining in the open portion as a mask,
    wherein said forming of said covering layer and said wet-etching are continuously performed using an apparatus provided with a coater and a wet etcher.

14. A method of manufacturing a semiconductor device, comprising:
    forming a lower resist film over a surface of a substrate;
    forming an upper resist film on the lower resist film, said upper resist film being insoluble in water;
    patterning the upper resist film to form an upper resist pattern;
    forming a covering layer containing silicon or a metal on the upper resist pattern by a coating method using an aqueous solution of a water-soluble polymer containing silicon or a metal;
    etching or polishing a surface of the covering layer until a surface of the upper resist pattern is exposed, thereby allowing the covering layer to selectively remain in an open portion of the upper resist pattern; and
    etching the upper resist pattern and the lower resist film to form a lower resist pattern, using the covering layer remaining in the open portion as a mask.

* * * * *

UNITED STATES PATENT AND TRADEMARK OFFICE
CERTIFICATE OF CORRECTION

PATENT NO. : 6,814,879 B2   Page 1 of 1
DATED : November 9, 2004
INVENTOR(S) : Shibata It is certified that error appears in the above-identified patent and that said Letters Patent is hereby corrected as shown below:

Column 14,
Line 63, change "claim 1," to -- claim 13, --.

Column 15,
Lines 7 and 9, change "claim 1," to -- claim 13, --.

Signed and Sealed this

Tenth Day of May, 2005

JON W. DUDAS
*Director of the United States Patent and Trademark Office*